United States Patent [19]

Bierlein et al.

[11] Patent Number: 4,740,265
[45] Date of Patent: Apr. 26, 1988

[54] PROCESS FOR PRODUCING AN OPTICAL WAVEGUIDE AND THE PRODUCT THEREFROM

[75] Inventors: John D. Bierlein, Wilmington, Del.; Lothar H. Brixner, West Chester, Pa.; August Ferretti; William Y. Hsu, both of Wilmington, Del.

[73] Assignee: E. I. Du Pont de Nemours and Company, Wilmington, Del.

[21] Appl. No.: 1,417

[22] Filed: Jan. 8, 1987

[51] Int. Cl.$^4$ .................. B01J 17/24; B05D 5/06
[52] U.S. Cl. .................. 156/624; 156/DIG. 71; 156/DIG. 75; 156/DIG. 81; 156/607; 350/96.12; 350/96.15; 350/96.3; 350/96.34; 427/164
[58] Field of Search .......... 156/624, 18, 24, DIG. 71, 156/DIG. 75, DIG. 81, 607; 350/96.12, 96.15, 96.3, 96.34; 427/164, 86

[56] References Cited

U.S. PATENT DOCUMENTS

| | | | |
|---|---|---|---|
| 3,811,912 | 5/1974 | Ramaswamy | 350/96.12 |
| 3,949,323 | 4/1976 | Bierlein et al. | 337/7.51 |
| 3,998,687 | 12/1976 | Ballman et al. | 156/619 |
| 4,037,005 | 7/1977 | Phillips | 427/162 |
| 4,073,675 | 2/1978 | Ballman et al. | 156/600 |
| 4,206,251 | 6/1980 | Chen | 427/100 |
| 4,231,838 | 11/1980 | Gier | 156/600 |
| 4,284,663 | 8/1981 | Carruthers et al. | 427/164 |
| 4,305,778 | 12/1981 | Gier | 156/623 R |
| 4,329,016 | 5/1982 | Chen | 350/96.12 |

FOREIGN PATENT DOCUMENTS 0004974 10/1979 European Pat. Off. .... 156/DIG. 75

OTHER PUBLICATIONS

Ishitani, et al., Appl. Phy. Lett 29, 289-291 (1976).
Zumsteg, et al., Journal of Applied Physics 47, 4980-4985 (1976).
Belt, et al., Laser Focus/Electro-optics, 110-124 (Oct. 1985).
Massey, et al., Applied Optics 24, 4136-4137 (1980).

Primary Examiner—Asok Pal

[57] ABSTRACT

There is disclosed a process for producing an optical waveguide comprising contacting at least one optically smooth surface of a single crystal of $K_{1-x}Rb_xTiOMO_4$ wherein x is from 0 to 1 and M is P or As with a specified molten salt of at least one of Rb, Cs and Tl at a temperature of from about 200° C. to about 600° C. for a time sufficient to increase the surface index of refraction at least about 0.00025 with respect to the index of refraction of the starting crystal, and cooling the resulting crystal. The product made thereby and a waveguide device using the same are also disclosed.

8 Claims, No Drawings

PROCESS FOR PRODUCING AN OPTICAL WAVEGUIDE AND THE PRODUCT THEREFROM

BACKGROUND OF THE INVENTION

1. Field of the Invention

This invention relates to optical waveguides and a process for making them.

2. Description of Related Art

Much work has been directed toward developing optical communications systems. The basic element of such systems is the optical waveguide which transmits or guides optical waves from one point to another and serves to connect various devices in an optical integrated circuit. Such waveguides consist of an optically transparent waveguiding medium surrounded by media with lower indices of refraction so that light propagating along the waveguide is totally reflected at the boundaries with the surrounding media. In optical integrated circuits, the two basic waveguide geometries are the planar or slab waveguide and the channel or strip waveguide.

U.S. Pat. No. 3,998,687, issued to Ballman, et al., on Dec. 21, 1976, discloses a technique for growing an epitaxial thin film of lithium niobate involving immersing a lithium tantalate substrate seed crystal into a supercooled melt of a flux system selected from among $Li_2B_2O_4$-$Li_2Nb_2O_6$, $Li_2WO_4$-$Li_2Nb_2O_6$, $K_2WO_4$-$Li_2Nb_2O_6$, and $WO_3$-$Li_2Nb_2O_6$, and after establishing equilibrium, withdrawing the seed from the flux and cooling the withdrawn seed. The films are disclosed to be useful as optical waveguides.

U.S. Pat. No. 4,073,675, issued to Ballman, et al., on Feb. 14, 1978, discloses a process for producing epitaxial crystalline films of $LiNbO_3$ on $LiTaO_3$ substrates on a selected crystallographic plane comprising applying a powder of $LiNbO_3$ on the $LiTaO_3$ substrate, heating to a temperature above the melting temperature of $LiNbO_3$ but below the melting temperature of $LiTaO_3$, and then cooling slowly, i.e., between 10° and 50° C. per hour to below the melting point of $LiNbO_3$.

U.S. Pat. No. 4,037,005, issued to Phillips on July 19, 1977, discloses a method for making optical waveguides wherein a niobium or niobium-oxide coated single crystal of lithium tantalate is heated to allow niobium to diffuse into the crystal and then the crystal is cooled. When the crystal is coated with niobium, the niobium is oxidized during the lower temperature range in the heating step. Diffusion occurs at about 1050° to 1250° C.

U.S. Pat. No. 4,284,663, issued to Carruthers, et al., on Aug. 18, 1981, discloses a method of fabricating an optical waveguiding surface layer in an optically transparent crystalline substrate, such as lithium niobate, by depositing a layer of a metal selected from transition element metals having an atomic number of 21 to 30, as well as silver and gold, onto a surface of the substrate and heating the resultant product at about 800° C. to 1100° C. to indiffuse the metal.

U.S. Pat. No. 4,206,251, issued to Chen on June 3, 1980, and U.S. Pat. No. 4,329,016, issued to Chen on May 11, 1982, disclose a process for diffusing a metal into a substrate which may be either a semiconductor material or a dielectric material comprising coating the substrate with a liquid composition comprising organometallic solutions of the desired metal and silica, heating the resulting coated substrate at an elevated temperature for a period of time sufficient to cause the organic portion of the solution to decompose, thereby leaving a composite film comprising an oxide of the desired metal and silica, heating the resulting structure further to cause diffusion of the metal from the metal oxide into the substrate. $LiNbO_3$ is specifically mentioned as a substrate and diffusion of Ti is specifically discussed. The patents also disclose the optical waveguide device formed by the process. The composite film formed in the process prevents $Li_2O$ out-diffusion.

Ishitani, et al, *Appl. Phys. Lett* 29, 289–291 (1976), disclose an optical waveguide comprising a single-crystal $Sr_2Nb_2O_7$ film grown onto a b-plate $Sr_2Ta_2O_7$ single-crystal substrate by rf sputtering.

U.S. Pat. No. 3,949,323, issued to Bierlein, et al., on Apr. 6, 1976, discloses nonlinear optical devices and electro-optic modulators which use a crystal consisting of a compound having the formula $MTiO(XO_4)$, wherein M is at least one of K, Rb, Tl or $NH_4$ and X is at least one of P or As and wherein X is P when M is $NH_4$.

Zumsteg, et al., *Journal of Applied Physics* 47, 4980–4985 (1976), disclose that $K_xRb_{1-x}TiOPO_4$ is a nonlinear optical (NLO) material with large NLO coefficients, transparent over a large range of wavelengths, not readily susceptible to laser damage, and chemically inert.

U.S. Pat. No. 4,231,838, issued to Gier on Nov. 4, 1980, discloses a process for the manufacture of single crystals of $MTiOXO_4$, wherein M is K, Rb or Tl and X is P or As, of optical quality and of sufficient size for use in nonlinear optical devices, said process comprising heating starting ingredients, chosen to be within the region of the ternary phase diagram in which the desired crystal $MTiOXO_4$ product is the only stable solid phase, to produce $MTiOXO_4$, and then controllably cooling to crystallize the desired product. Crystals which have mixtures of elements for M and/or X can be grown by the process.

U.S. Pat. No. 4,305,778, issued to Gier on Dec. 15, 1981, discloses a hydrothermal process for growing single crystals of $MTiOXO_4$, wherein M is K or Rb and X is P or As, said process involving using as a mineralizing solution an aqueous solution of a glass defined by specified portions of the ternary diagrams for the selected $M_2O/X_2O_5/(TiO_2)_2$ system.

Publications discussing the nonlinear or electro-optic properties of $KTiOPO_4$ (KTP) include Belt, et al., *Laser Focus/Electro-optics*, 110–124 (Oct. 1985), and Massey, et al., *Applied Optics* 24, 4136–4137 (1980).

SUMMARY OF THE INVENTION

The present invention provides a process for producing an optical waveguide comprising contacting at least one optically smooth surface of a single crystal of $K_{1-x}Rb_xTiOMO_4$ wherein x is from 0 to 1 and M is P or As with a molten salt of at least one of Rb, Cs and Tl at a temperature of from about 200° C. to about 600° C. for a time sufficient to increase the surface index of refraction at least about 0.00025 with respect to the index of refraction of the starting crystal, and cooling the resulting crystal; with the provisos that (a) said salt is selected from the group consisting of $RbNO_3$, $CsNO_3$, $TlNO_3$, RbCl-LiCl eutectic, and $RbNO_3$-$Ca(NO_3)_2$ eutectic; and (b) when x is at least about 0.8, the salt is $CsNO_3$ or $TlNO_3$. The invention also provides the novel waveguide made by the aforesaid process and a device using the same.

DETAILED DESCRIPTION OF THE INVENTION

For slab or channel waveguides, it is necessary that the material through which the light is propagated have an index of refraction larger than that of surrounding media. However, in order that the light is propagated along and is confined to the slab or channel material there are more stringent requirements. Generally, modes of propagation are classified into two kinds according to the orientation of the field vectors: those with transverse electric fields (TE modes) and those with transverse magnetic fields (TM modes). The solutions to Maxwell's equations for these modes for a slab waveguide are well-known (see, e.g., "Optical Waves in Crystals", Yariv, et al., John Wiley & Sons, New York, Chapter 11 (1984); or "Integrated Optics: Theory and Technology", Hunsperger, Springer-Verlag, Berlin, 16–37 (1982). The number of such confined modes depends on the frequency of the light wave, the depth of the slab, and the indices of refraction of the three media involved, i.e., that of the substrate or plate material, $n_s$, that of the slab waveguide material, $n_s + \Delta n$, and that of the material above the top surface of the slab waveguide, $n_a$. For a given frequency, the number of confined modes increases with increasing slab depth or with increasing index of refraction of the slab, i.e., with increasing $\Delta n$. For an extremely thin slab or an extremely small $\Delta n$, no mode is confined. As the depth of the slab and/or $\Delta n$ is increased, one mode becomes confined, then another, etc.

The solutions of Maxwell's equations for confined modes for a channel waveguide are more complicated than for a slab waveguide. For this reason, only approximate solutions have been obtained (see "Integrated Optics: Theory and Technology", Hunsperger, Springer-Verlag, Berlin, 38–43 (1982)). For a given value of $\Delta n$, there are certain minimum values for the depth and width of the of the channel in order for the channel to be able to confine a mode. These depth and width values are not independent, i.e., to confine a given mode, wider channels can be less deep while narrower channels require a greater depth. Typically, the depths and widths, of approximately square channel waveguides are several times the depth of a slab waveguide. For both slab and channel waveguides, the index of refraction must be large enough so that at least one mode is confined.

In the process of the invention a single crystal of $K_{1-x}Rb_xTiOMO_4$, wherein x is from 0 to 1 and M is P or As, having at least one optically smooth surface is contacted with a molten salt of at least one of Rb, Cs and Tl. Preferably, x is 0 and M is P. Single crystals for use in the present process can be prepared by the processes disclosed in U.S. Pat. Nos. 3,949,323, 4,231,838 and 4,305,778. Rb, Cs and Tl salts-suitable for use in the present process are selected from the nitrates, RbCl-LiCl eutectic and $RbNO_3$-$Ca(NO_3)_2$ eutectic, but nitrates are preferred. When x is other than 0, $Rb^+$ ions can serve as a replacement ion for $K^+$ ions, if the number of replacement $Rb^+$ ions is sufficient to result in an increase in the surface refractive index of at least about 0.00025 with respect to the refractive index of the starting crystal. For practical reasons, when x is about 0.80 or more, the replacement ions are $Cs^+$ or $Tl^+$.

At least one optically smooth surface of the single crystal is contacted with the molten salt at a temperature of from about 200° C. to about 600° C. for a time sufficient to increase the surface index of refraction at least about 0.00025 with respect to the index of refraction of the starting single crystal. As used herein the expression "optically smooth surface" means a surface which is smooth over a distance that is small compared to the wavelength of the optical wave to be propagated, i.e., sufficiently smooth to result in substantially no scattering of light and with no sub-surface damage that would result in scattering of the guided mode. An optically smooth surface can be provided by a natural face of the crystal as obtained by cleaving a crystal, by flux growth, or by well-known mechanical or chemical polishing techniques. Preferably, the temperature is from about 325° C. to about 450° C. when x is 0. Above 450° C. some etching of the crystal surface may occur. Hence, it is preferred to conduct the contacting below this temperature to avoid surface defects resulting from etching, which defects could cause scattering and attenuation of the optical wave.

The contacting of the optically smooth surface with a molten salt can be conducted in various ways. For example, the salt in the form of a powder can be sprinkled onto the optically smooth surface of the crystal, and then the crystal heated to a temperature within the above-prescribed temperature range and which is above the melting point of the salt. Alternatively, the crystal can be placed in a crucible, preferably made of platinum, gold or silica, and covered with the salt in a powder form. The crucible is then heated in a furnace with adequate temperature control, e.g., a belt furnace, to a temperature as prescribed above. Special precautions should be taken when handling thallium salts. In another embodiment, which is preferred, the salt is melted in a platinum or gold crucible. The optically smooth crystal is placed in a platinum or gold basket, and then the basket is slowly lowered until the crystal is immersed in the molten salt. After the crystal remains in contact with the molten salt for a sufficient time, the basket is withdrawn to a position just above the surface of the melt to allow the molten salt to drain from the basket. Then the basket is slowly removed from the furnace and allowed to cool to ambient temperature, i.e. about 22° C.

The surface of the single crystal is contacted with the molten salt at the above-prescribed temperature for a time sufficient to increase the surface index of refraction at least about 0.00025, preferably at least about 0.001, with respect to the index of refraction of the starting single crystal. As used herein, the waveguide thickness, d, and the increase in the surface index of refraction, $\Delta n$, are the corresponding effective parameters as determined by the method of Tien, et al., *Applied Physics Letters* 14, 291–294 (1969). In general, the contact time at about 350° C. will be from about 15 minutes to about 6 hours. The contact time allows the Rb, Cs or Tl ions to diffuse into surface of the single crystal and replace the potassium ions there. The specific diffusion temperature and diffusion time needed to form an optical waveguide depends on the ionic conductivity of the crystal. A parameter which is a measure of the ionic conductivity is the dielectric loss angle $\delta$, defined as tan $\delta = \epsilon''/\epsilon'$, where $\epsilon = \epsilon' - i\epsilon''$ is the complex dielectric constant. An increase in tan $\delta$ correlates with an increase in the ionic conductivity. For a typical $KTiOPO_4$ substrate single crystal with tan $\delta = 2.0$ measured at 10 kHz and using $RbNO_3$ as the molten salt, at a heating temperature of 350° C. the major portion of the exchange occurs in the first 15 minutes of contact with the molten nitrate. The effective waveguide thickness and the effective increase in the surface index of refraction are nearly independent of heating temperature as the temperature is increased from 350° C. to 450° C. In addition, annealing a Rb-exchanged waveguide of the invention in air at 300° C. to 350° C. for 0.5 to 2 hours results in no significant change in d or Δn. For substrate crystals with lower tan δ, higher temperatures and/or longer diffusion times are required to form waveguides with similar thicknesses and increases in surface index of refraction. These observations indicate that the waveguides made by the process of the invention can be produced in relatively short times and at relatively low temperatures and that the effective parameters of the waveguides made thereby are thermally stable. Heating a waveguide of the invention above the diffusion temperature, e.g. above 400° C. for a Rb-exchanged KTiOPO$_4$ waveguide, can alter the concentration profile of the replacement ion and the refractive index profile with distance into the surface layer. For example, when a Rb-exchanged KTiOPO$_4$ waveguide of the invention is heated above about 400° C. for at least 0.5 hour, the concentration profile of the Rb$^+$ ions, d and Δn change but the waveguide still meets the requirements of the invention.

After the crystal is contacted with the molten salt as prescribed herein, it is cooled to ambient temperature, i.e., about 22° C., and preferably then washed in water to remove excess salt from the surfaces of the crystal.

When channel waveguides are to be formed, suitable masking must be used so that only the unmasked portions of the surface are contacted with the molten salt. Such masking procedures are well-known in the art. For example, a conventional method consists of applying a resist such as a photoresist which polymerizes when irradiated by light. The photoresist is applied to the optically smooth surface of the single crystal and irradiated with a pattern of light to polymerize the resist in those regions where the channel waveguide is to be formed. The unpolymerized portions of the resist are washed away. A metal film of Au or Ag which is typically 500 to 5000 Å (50 to 500 nm) in thickness is deposited onto the crystal surface and the polymerized resist. The polymerized portion of the resist and the metal covering it are then removed, thereby exposing those portions of the crystal surface which will be contacted with the molten salt to form the desired channels. The remaining metal serves as a mask to cover the rest of the crystal surface to prevent ion diffusion in those portions of the surface.

In a preferred embodiment of the process of the invention, the surface of the crystal which is contacted with the molten salt is a z-surface, i.e., a surface perpendicular to the c- or z-axis. The ion diffusion of the Rb, Cs and/or Tl ions into the crystal surface is highly anisotropic with diffusion along the z-axis being much greater. Therefore, it is important in producing rectangular channel waveguides by the process of the invention that a z-surface be contacted with the molten salt in order to minimize any lateral diffusion of Rb, Cs and Tl ions out of the channel region. The channel waveguides prepared on z-surfaces by the process of the invention are optically uniform over the width of the channel and display no apparent evidence of lateral ion diffusion. Other surfaces can be used to produce channel waveguides with other shapes.

Another aspect of the invention is the channel or slab waveguide made by the foregoing described process of the invention. The waveguide of the invention is a K$_{1-x}$Rb$_x$TiOMO$_4$ single crystal, wherein x is from 0 to 1 and M is P or As, having at least one optically smooth surface in which sufficient cations ions have been replaced by ions selected from at least one of Rb$^+$, Cs$^+$ and Tl$^+$ ions to result in an increase in the surface refractive index of at least about 0.00025, preferably at least about 0.001, with respect to the refractive index of the starting crystal. When x is at least about 0.8, the replacement ions are selected from at least one of Cs$^+$ and Tl$^+$ ions. The depth of the surface layer is at least about 0.25 μm. Sufficient cations in the surface layer are replaced with rubidium, cesium and/or thallium to result in the above-stated increase in the surface index of refraction and the necessary depth of the surface layer.

Electron microprobe measurements on waveguides produced by the process of the invention show that the concentration, C, of rubidium, cesium and thallium is a maximum at the surface of the crystal and decreases to zero with increasing distance into the surface layer substantially according to the complementary error function, $$C(x) = C_o \operatorname{erfc}(x/d)$$

where C(x) is the concentration of Rb, Cs and/or Tl as a function of distance, x, from the surface, C$_o$ is the concentration of Rb, Cs and/or Tl at the surface and d is the characteristic depth. The refractive index profile with distance into the surface layer is believed to follow the Rb, Cs and/or Tl concentration and be a maximum at the surface and decrease according to the complementary error function as the refractive index approaches the value for KTiOPO$_4$ or KTiOAsO$_4$.

The slab or channel optical waveguides produced by the process of the invention are useful in various optical devices, such as modulators and switches as discussed by Hunsberger, "Integrated Optics: Theory and Technology", Springer-Verlag, Berlin, 107-157 (1982).

The optical waveguide device of the invention comprises at least one channel waveguide, means to couple an incoming optical wave into a channel waveguide and means to couple an outgoing optical wave out of a channel waveguide. The channel waveguide is a single crystal according to the invention. The crystal can have more than one channel waveguide. Light can be coupled into and out of the device by attaching an aligned fiber and into and out of a waveguide by abutting an aligned fiber to an end of the waveguide.

The invention is further illustrated by the following examples in which all percentages and parts are by weight and temperatures are in degrees Celsius unless otherwise stated. The waveguide thickness, d, and the increase in the index of refraction, Δn, given in the examples were determined by the method of Tien et al. referred to earlier herein by examining the samples for waveguiding by the m-line prism-layer coupler technique described in that article using a 45°-45°-90° rutile prism and an He-Ne laser.

EXAMPLE 1

A slab waveguide was prepared by sprinkling RbNO$_3$ powder onto the polished x-surface (surface perpendicular to the x-axis) of a KTiOPO$_4$ crystal to a depth of about 0.5 mm and heating the crystal to about 330° for 2 hours. The resulting crystal was cooled to room temperature, and then was washed with water to remove excess $RbNO_3$.

The resulting waveguide was then examined by the m-line prism-layer coupler technique and 2 TM waveguide modes were observed. The results are summarized in Table 1.

EXAMPLE 2

A slab waveguide was prepared by placing a $KTiOPO_4$ crystal with a polished x-surface in a platinum crucible, covering the crystal with $RbNO_3$ powder, heating the crucible to 450° for 20 minutes, cooling the crucible to ambient temperature, and washing the resulting crystal with water to remove excess $RbNO_3$.

The resulting waveguide was then examined by the m-line prism-layer coupler technique. One TM waveguide mode was observed. The thickness d of the waveguide was estimated to be 1.3 μm and the increase in the index of refraction, $\Delta n$, of the waveguiding material to be 0.02. The results are summarized in Table 1.

EXAMPLE 3

A slab waveguide was prepared in the following manner. The two z-surfaces of a $KTiOPO_4$ single crystal about 5 mm × 5 mm × 1 mm thick, were polished with the negative z-surface, $z(-)$, corresponding to a positive pyroelectric constant and the positive z-surface, $z(+)$, corresponding to a negative pyroelectric constant. A loop of Pt wire was placed around the crystal to prevent possible floatation, and the crystal placed on the bottom of a 20 mL platinum crucible. The crystal was then covered with about 8 grams of $RbNO_3$ powder. The crucible was then placed on the belt of a BTU belt furnace which had an overall length of 193 cm (72 inches) with a 61 cm (24 inch) hot zone. The crucible was moved into the hot zone at a rate of 1.3 cm per minute (½ inch per minute), held at a temperature of 350° for 4 hours, and moved out of the hot zone at a rate of 0.64 cm per minute (¼ inch per minute). Heating was carried out in a nitrogen atmosphere. The crystal was allowed to cool to room temperature and then washed in water to remove $RbNO_3$.

The resulting waveguide was then examined by the m-line prism-layer coupler technique. Three TE modes and 3 TM modes were observed for the slab waveguide on the $z(+)$ surface and from these measurements d was estimated to be 4.0 μm and $\Delta n$ to be 0.019 from the TE measurements and 0.018 from the TM measurements. Three TE modes and 2 TM modes were observed for the slab waveguide on the $z(-)$ surface and from these measurements d was estimated to be 6.5 μm and $\Delta n$ to be 0.018 from both the TE and the TM measurements. These results are summarized in Table 1.

EXAMPLE 4 and 5

The waveguides were prepared using procedures substantially similar to that used in Example 3. The crystal surface used, the molten material, the temperature of the molten material, the time of contact of the molten material with the crystal surface, the number of modes observed, and the effective thickness and the effective increase in the index of refraction of the waveguiding material are given in Table 1.

EXAMPLE 6

A waveguide was prepared using a procedure substantially similar to that used in Example 3 except for the heating step and the molten material. The platinum crucible containing the crystal with a polished z-surface was covered with about 8 grams of $TlNO_3$. For safety reasons, the crucible was heated in a programmable tube furnace with flowing nitrogen. The crucible was heated to 335° in 1 hour, held at 335° for 4 hours and cooled to ambient temperature over a 1-hour period. The resulting crystal was then washed in water and examined by the m-line, prism-layer coupler technique. The results are summarized in Table 1.

EXAMPLE 7

A slab waveguide was prepared according to the following procedure. About 35 grams of $RbNO_3$ were melted in a 25 mL gold crucible and held at a temperature of 350°. A $KTiOPO_4$ crystal with a polished z-surface was placed in a platinum basket and slowly lowered into the molten $RbNO_3$. The crystal was held immersed in the molten $RbNO_3$ for about 1 hour, and the basket was withdrawn to a position above the surface of the molten $RbNO_3$ to allow the molten salt to drain from the basket. The basket was slowly removed from the furnace and allowed to cool to ambient temperature. The crystal was then washed in distilled water to remove remaining traces of $RbNO_3$.

The resulting waveguide was then examined by the m-line prism-layer coupler technique. The results are summarized in Table 1.

EXAMPLE 8

A channel waveguide was prepared using a procedure substantially similar to that used in Example 7 except that a metal mask was formed on the crystal surface before it was immersed in the $RbNO_3$ as described below.

A polyester, adhesive, masking tape strip about 1 mm wide was applied to the polished z-surface of the crystal. A layer of gold approximately 500 Å (50 nm) was then sputtered onto the z-surface to form a mask. The tape was removed to expose the crystal surface beneath it. The crystal with the gold mask was then placed in a platinum basket and immersed in molten $RbNO_3$ at 350° C. for about 1 hour. After the cooled crystal was taken from the basket, the metal mask was removed using water and a polishing cloth.

The surface was then examined by the m-line prism-layer coupler technique. No waveguiding was found in the region of the surface which had been under the gold mask and had not come into contact with the molten $RbNO_3$. However, both TE and TM modes were observed for the region of the surface which was not under the mask and which had come into direct contact with the molten $RbNO_3$. The results are summarized in Table 1.

TABLE 1

| Ex. | Molten Mat'l | Temp. (°C.) | Contact Time (hours) | Crystal Surface Used | Type Modes Obsd. | No. Modes Obsd. | d (μm) | $\Delta n$ |
| --- | --- | --- | --- | --- | --- | --- | --- | --- |
| 1 | $RbNO_3$ | 330 | 2.0 | x | TE | 0 | | |
| | | | | | TM | 2 | — | >0.001 |
| 2 | $RbNO_3$ | 450 | 3.3 | x | TE | 0 | | |
| | | | | | TM | 1 | 1.3 | 0.02 |

TABLE 1-continued

| Ex. | Molten Mat'l | Temp. (°C.) | Contact Time (hours) | Crystal Surface Used | Type Modes Obsd. | No. Modes Obsd. | d (μm) | Δn |
|---|---|---|---|---|---|---|---|---|
| 3 | $RbNO_3$ | 350 | 4.0 | z(+) | TE | 3 | 4.0 | 0.019 |
|   |   |   |   |   | TM | 3 | 4.0 | 0.018 |
|   |   |   |   | z(−) | TE | 3 | 6.5 | 0.008 |
|   |   |   |   |   | TM | 2 | 6.5 | 0.008 |
| 4 | $RbNO_3$ | 350 | 4.0 | z(−) | TE | 2 | 5.6 | 0.009 |
|   |   |   |   |   | TM | 2 | 5.6 | 0.009 |
| 5 | $CsNO_3$ | 450 | 4.0 | z | TE | 11 | 13 | 0.028 |
|   |   |   |   |   | TM | 8 | 13 | 0.019 |
| 6 | $TlNO_3$ | 335 | 4.0 | z | TE | 4 | 1.6 | 0.23 |
|   |   |   |   |   | TM | 4 | 1.6 | 0.18 |
| 7 | $RbNO_3$ | 350 | 1.0 | z | TE | 2 | 7.9 | 0.0027 |
|   |   |   |   |   | TM | 2 | 7.0 | 0.0020 |
| 8 | $RbNO_3$ | 350 | 1.0 | z | TE | 2 | 9.1 | 0.00185 |
|   |   |   |   |   | TM | 2 | 9.1 | 0.00135 |

The invention being claimed is:

1. An optical waveguide comprising a $K_{1-x}Rb_xTiOMO_4$ single crystal substrate, wherein x is from 0 to 1 and M is P or As, having at least one optically smooth surface wherein sufficient cations have been replaced by ions selected from at least one of $Rb^+$, $Cs^+$ and $Tl^+$ ions to result in an increase in the surface index of refraction at least about 0.00025 with respect to the index of refraction of the starting crystal, the surface layer wherein the cations are so replaced having a depth of at least about 0.25 μm, with the proviso that when x is at least about 0.8, the replacement ions are selected from at least one of $Cs^+$ and $Tl^+$ ions.

2. An optical waveguide according to claim 1 wherein the single crystal substrate is $KTiOPO_4$.

3. An optical waveguide according to claim 2 wherein the $K^+$ ions are replaced by $Rb^+$ ions.

4. An optical waveguide according to claim 3 wherein the increase in the surface index of refraction is at least about 0.001.

5. In an optical waveguide device comprising at least one channel waveguide, means to couple an incoming optical wave into said channel waveguide and means to couple an outgoing optical wave out of said channel waveguide, the improvement wherein the channel waveguide comprises a $K_{1-x}Rb_xTiOMO_4$ single crystal substrate, wherein x is from 0 to 1 and M is P or As, having at least one optically smooth surface wherein sufficient cations have been replaced by ions selected from at least one of $Rb^+$, $Cs^+$ and $Tl^+$ ions to result in an increase in the surface index of refraction at least about 0.00025 with respect to the index of refraction of the starting crystal, the surface layer wherein the cations are so replaced having a depth of at least about 0.25 μm, with the proviso that when x is at least about 0.8, the replacement ions are selected from at least one of $Cs^+$ and $Tl^+$ ions.

6. The optical waveguide device of claim 5 wherein the single crystal substrate of said channel waveguide is $KTiOPO_4$.

7. The optical waveguide device of claim 6 wherein the $K^+$ ions are replaced by $Rb^+$ ions.

8. The optical waveguide device of claim 7 wherein the increase in the surface index of refraction is at least about 0.001 with respect to the index of refraction of the starting crystal.

* * * * *